(12) United States Patent
Hwang et al.

(10) Patent No.: US 9,503,036 B2
(45) Date of Patent: Nov. 22, 2016

(54) POWER AMPLIFIER HAVING STACK STRUCTURE

(71) Applicant: SOONGSIL UNIVERSITY RESEARCH CONSORTIUM TECHNO-PARK, Seoul (KR)

(72) Inventors: Ho Yong Hwang, Gyeongsangnam-do (KR); Chang Kun Park, Gyeonggi-do (KR)

(73) Assignee: SOONGSIL UNIVERSITY RESEARCH CONSORTIUM TECHNO-PARK, Seoul (KR)

( * ) Notice: Subject to any disclaimer, the term of this patent is extended or adjusted under 35 U.S.C. 154(b) by 28 days.

(21) Appl. No.: 14/407,965

(22) PCT Filed: Oct. 19, 2012

(86) PCT No.: PCT/KR2012/008598
§ 371 (c)(1),
(2) Date: Dec. 15, 2014

(87) PCT Pub. No.: WO2014/017699
PCT Pub. Date: Jan. 30, 2014

(65) Prior Publication Data
US 2015/0171804 A1 Jun. 18, 2015

(30) Foreign Application Priority Data
Jul. 27, 2012 (KR) .......................... 10-2012-0082535

(51) Int. Cl.
*H03F 1/30* (2006.01)
*H03F 3/21* (2006.01)
(Continued)

(52) U.S. Cl.
CPC ............. *H03F 3/211* (2013.01); *H03F 1/0283* (2013.01); *H03F 3/195* (2013.01); *H03F 3/245* (2013.01);
(Continued)

(58) Field of Classification Search
CPC ........................................................ H03F 1/30
USPC .................................. 330/297, 310, 98, 150
See application file for complete search history.

(56) References Cited

U.S. PATENT DOCUMENTS 3,195,065 A * 7/1965 Grant ....................... H03F 1/302
330/289
6,501,331 B2 * 12/2002 Adar ....................... H03F 1/0261
330/126

(Continued)

FOREIGN PATENT DOCUMENTS

| KR | 10-0775942 B1 | 11/2007 |
| KR | 10-2008-0109523 A | 12/2008 |
| KR | 10-2011-0048258 A | 5/2011 |
| KR | 10-2011-0069685 A | 6/2011 |

OTHER PUBLICATIONS

International Search Report for PCT/KR2012/008598 mailed Feb. 5, 2013 from Korean Intellectual Property Office.

*Primary Examiner* — Henry Choe
(74) *Attorney, Agent, or Firm* — Revolution IP, PLLC (57) ABSTRACT

A power amplifier having a stack structure, including: a first driver stage that receives a power voltage from a power supply and receives and amplifies an input signal; a second driver stage that has a power input terminal connected with a ground terminal of the first driver stage and receiving a virtual power voltage and an input terminal connected with an output terminal of the first driver stage, and receives and amplifies an output signal from the first driver stage; and a power stage that receives the power voltage from the power supply, has an input terminal connected with an output terminal of the second driver stage, and receives and amplifies an output signal from the second driver stage.

10 Claims, 5 Drawing Sheets

(51) Int. Cl.
*H03F 3/45* (2006.01)
*H03F 1/02* (2006.01)
*H03F 3/195* (2006.01)
*H03F 3/24* (2006.01)
*H03F 3/30* (2006.01)

(52) U.S. Cl.
CPC ........ *H03F 3/3028* (2013.01); *H03F 3/45179* (2013.01); *H03F 3/45237* (2013.01); *H03F 2200/405* (2013.01); *H03F 2200/408* (2013.01); *H03F 2200/516* (2013.01); *H03F 2203/45481* (2013.01); *H03F 2203/45544* (2013.01); *H03F 2203/45594* (2013.01); *H03F 2203/45631* (2013.01)

(56) References Cited

U.S. PATENT DOCUMENTS

| | | | |
|---|---|---|---|
| 6,885,246 B2* | 4/2005 | Tsutsui | H03G 3/007 330/133 |
| 7,417,508 B1* | 8/2008 | Quaglietta | H03F 1/56 330/124 R |
| 7,944,307 B2 | 5/2011 | Goldfarb et al. | |
| 7,944,311 B1 | 5/2011 | Jeon et al. | |
| 8,742,499 B2* | 6/2014 | Nakajima | H01L 24/73 257/197 |
| 2008/0309411 A1 | 12/2008 | Kim et al. | |
| 2011/0102084 A1 | 5/2011 | Kim et al. | |
| 2011/0109393 A1 | 5/2011 | Adamski et al. | |

\* cited by examiner

POWER AMPLIFIER HAVING STACK STRUCTURE

CROSS REFERENCE TO PRIOR APPLICATIONS

This application is a National Stage Application of PCT International Patent Application No. PCT/KR2012/008598 filed on Oct. 19, 2012, under 35 U.S.C. §371, which claims priority to Korean Patent Application No. 10-2012-0082535 filed on Jul. 27, 2012, which are all hereby incorporated by reference in their entirety.

TECHNICAL FIELD

The present invention relates to a power amplifier having a stack structure, and more particularly, to a technology of connecting an amplifier for a driving amplifier stage in a stack structure.

BACKGROUND ART

A power amplifier includes a driver stage and a power stage. The driver stage is used to amplify an input signal in advance ahead of the power stage so that the maximum output is obtained at the power stage. In this case, there is a need for a power voltage VDD to amplify an input signal, but when a power amplifier is composed of a driver stage and a power stage, the amplification gains are different at the stages, so it is required to separately supply power voltages.

Figure 1:
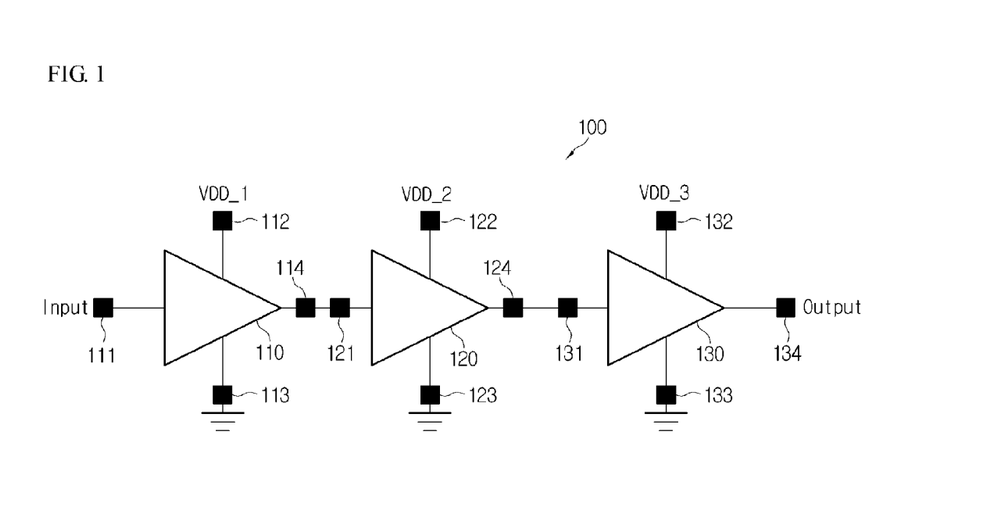
FIG. 1 is a circuit diagram of a multistage power amplifier of the related art.

FIG. 1 is a circuit diagram of a multistage power amplifier 100 of the related art. Referring to FIG. 1, the multistage power amplifier 100 of the related art includes a first driver stage 110, a second driver stage 120, and a power stage 130. In this case, the first driver stage 110 amplifies a first signal inputted through an input terminal 111 and outputs a second signal that is the amplified first signal to an input terminal 121, which is connected with an output terminal 114, of the second driver stage 120. The input terminal 121 of the second driver stage 120 is connected with the output terminal 114 of the first driver stage 110 and receives and amplifies the second signal and outputs a third signal that is the amplified second signal to an input terminal 131, which is connected with the output terminal 124, of the power stage 130. The power stage 130 amplifies the third signal inputted from the output terminal 124, which is connected with the input terminal 131, of the second driver stage 120 and outputs a fourth signal that is the amplified third signal through an output terminal 134.

In general, the first driver stage 110 and the second driver stage 120 require a low output power in comparison to the power stage 130. Accordingly, the multistage power amplifier 100 in which the first driver stage 110, the second driver stage 120, and the power stage 130 are connected in a cascade type, different power voltages are applied to the power input terminals 112 and 122 of the first driver stage 110 and the second driver stage 120 and the power input terminal 132 of the power amplifier 130, and their ground terminals 113, 123, and 133 are all grounded, has been developed. In this configuration, since the power voltage applied to the first and second driver stages 110 and 120 and the power voltage applied to the power stage 130 are different, there is a need for a specific regulator, so it reduces power efficiency, complicates an integrated circuit, and reduces the design area of the integrated circuit.

The background art of the present invention has been described in Korean Patent No. 10-0775942 (Nov. 6, 2007).

DISCLOSURE

Technical Problem

An object of the present invention is to provide a power amplifier having a stack structure including a small number of regulators for supplying a power voltage and a plurality of driver stages connected in a stack structure to reduce the design area of an integrated circuit for a multistage power supplier.

Technical Solution

An aspect of the present invention provides a power amplifier having a stack structure which includes: a first driver stage that receives a power voltage from a power supply and receives and amplifies an input signal; a second driver stage that has a power input terminal connected with a ground terminal of the first driver stage and receiving a virtual ground voltage and an input terminal connected with an output terminal of the first driver stage, and receives and amplifies an output signal from the first driver stage; and a power stage that receives the power voltage from the power supply, has an input terminal connected with an output terminal of the second driver stage, and receives and amplifies an output signal from the second driver stage.

Further, the power amplifier may further include a third driver stage that has a power input terminal connected with a ground terminal of the second driver stage and receiving a virtual ground voltage and an input terminal connected with an output terminal of the second driver stage, and receives and amplifies an output signal from the second driver stage, in which the power stage may receive and amplify an output signal from the third driver stage.

Further, the third driver stage may be repeatedly and sequentially connected at least once to the first or the second driver stage.

Further, the power amplifier may further include: a third driver stage that receives the power voltage from the power supply, has an input terminal connected with the output terminal of the first driver stage, and receives and amplifies an output signal from the first driver stage; and a fourth driver stage that has a power input terminal connected with ground terminals of the first and third driver stages and receiving a virtual ground voltage and an input terminal connected with an output terminal of the third driver stage, and receives and amplifies an output signal from the third driver stage, in which the input terminal of the second driver stage is connected with an output terminal of the fourth driver stage and the second driver stage receives and amplifies an output signal from the fourth driver stage.

Further, the third driver stage and the fourth driver stage may be repeatedly and sequentially connected at least once to correspond to the first driver stage and the second driver stage.

Further, the first driver stage may include: a first transistor that has a source receiving the power voltage from the power supply and a gate receiving a first input signal; a second transistor that has a polarity opposite to the polarity of the first transistor and has a drain connected with a drain of the first transistor and a gate receiving the first input signal; a third transistor that has a source receiving the power voltage from the power supply and a gate receiving a second input signal; and a fourth transistor that has a polarity opposite to the polarity of the third transistor and has a drain connected with a drain of the third transistor and a gate receiving the second input signal.

Further, the second driver stage may include: a fifth transistor that has a source connected with a source of the second transistor and a source of the fourth transistor and a gate connected with a drain of the first transistor and a drain of the second transistor; a sixth transistor that has a polarity opposite to the polarity of the fifth transistor and has a drain connected with a drain of the fifth transistor and a gate connected with the gate of the fifth transistor; a seventh transistor that has a source connected with the source of the second transistor and the source of the fourth transistor and a gate connected with a drain of the third transistor and the drain of the fourth transistor; and an eighth transistor that has a polarity opposite to the polarity of the seventh transistor and has a drain connected with a drain of the seventh transistor and a gate connected with the gate of the seventh transistor.

Further, the power amplifier may further include: a first resistor that has one end connected with the gate of the first transistor and the gate of the second transistor and the other end connected with the drain of the first transistor and the drain of the second transistor; and a second resistor that has one end connected with the gate of the third transistor and the gate of the fourth transistor and the other end connected with the drain of the third transistor and the drain of the fourth transistor.

Further, the power amplifier may further include: a third resistor that has one end connected with the gate of the fifth transistor and the gate of the sixth transistor and the other end connected with the drain of the fifth transistor and the drain of the sixth transistor; and a fourth resistor that has one end connected with the gate of the seventh transistor and the gate of the eighth transistor and the other end connected with the drain of the seventh transistor and the drain of the eighth transistor.

Further, the power stage may receive a first output signal by being connected with a node that is connected with the drains of the fifth transistor and the sixth transistor and may receive a second output signal by being connected with a node that is connected with the drains of the seventh transistor and the eighth transistor.

Further, a ground terminal of the second driver stage may be connected with a power input terminal of the first driver stage and a virtual ground voltage may be applied to the first driver stage, and the power voltage may be applied to the second driver stage from the power supply.

Another aspect of the present invention provides a power amplifier having a stack structure which includes: a first driver stage that receives a power voltage from a power supply and receives and amplifies an input signal; a second driver stage that receives the power voltage from the power supply, has an input terminal connected with an output terminal of the first driver stage, and receives and amplifies an output signal from the first driver stage; and a power stage that has a power input terminal connected with a ground terminal of the first driver stage and a ground terminal of the second driver stage and receives a virtual ground voltage, and has an input terminal connected with an output terminal of the second driver stage and receives and amplifies an output signal from the second driver stage.

Further, the driver stage or the power stage may be implemented in a differential amplification structure or a single-ended amplification structure.

Advantageous Effects

Accordingly, a plurality of driver stages included in a multistage amplifier are connected in a stack structure, so that it is possible to reduce the number of regulators for supplying a power voltage and decrease the design area of an integrated circuit.

BEST MODE

Hereinafter, embodiments of the present invention are described with reference to the accompanying drawings. The terms used herein are terms selected in consideration of the functions in the embodiments and their meanings may depend on the intention of users and workers or precedents. Therefore, the meanings of the terms used in the following embodiments follow the definitions, if defined specifically herein, or should be construed as the meanings that those skilled in the art know, if not defined specifically.

Figure 2:
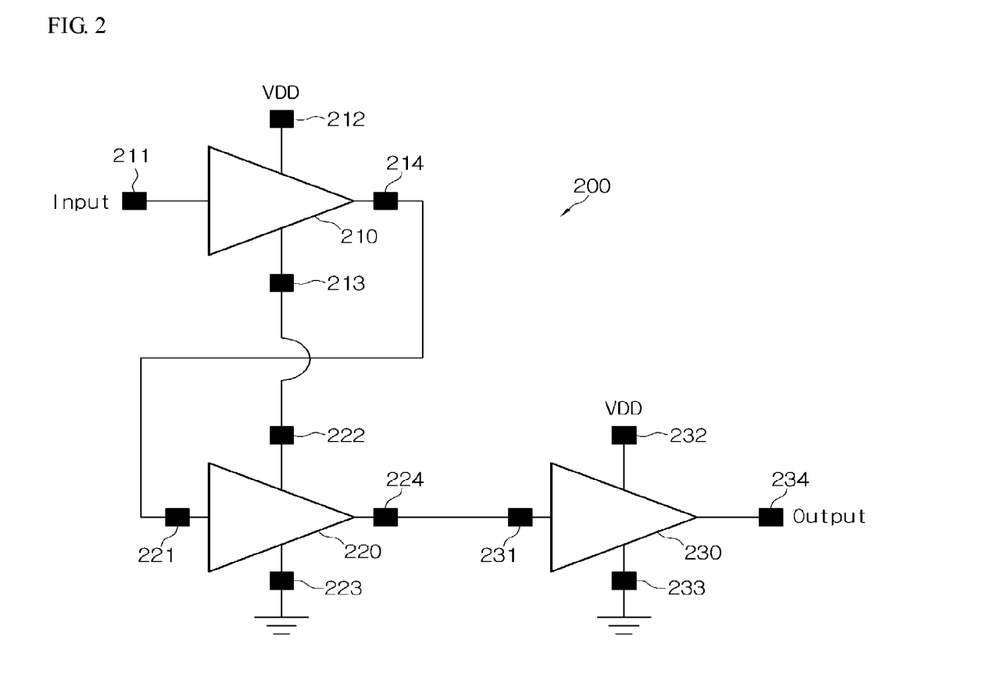
FIG. 2 is a circuit diagram of a power amplifier having a stack structure according to an embodiment of the present invention.

FIG. 2 is a circuit diagram of a power amplifier having a stack structure according to an embodiment of the present invention.

Referring to FIG. 2, a power amplifier 200 having a stack structure according to an embodiment of the present invention includes a first driver stage 210, a second driver stage 220, and a power stage 230.

The first driver stage 210 receives and amplifies an input signal and receives a power voltage from and a power supply (not illustrated). In detail, the first driver stage 210 receives and amplifies an input signal from an input terminal 211 and receives a power voltage from an external power supply through a power input terminal 212. Further, the first driver stage 210 has a ground terminal 213 connected with a power input terminal 222 of the second driver stage 220 and an output terminal 214 connected with an input terminal 221 of the second driver stage 220. In this configuration, the first driver stage 210 may have the amplification characteristic of any one of classes A, AB, B, C, D, E, F, and S.

The second driver stage 220 has an input terminal 221 connected with the output terminal 214 of the first driver stage 210 and receives and amplifies an output signal from the first driver stage 210 and has a power input terminal 222 connected with the ground terminal 213 of the first driver stage 210 and receiving a virtual ground voltage. Further, the ground terminal 223 of the second driver stage 220 is grounded and the output terminal 224 is connected with an input terminal 231 of the power stage 230. In this configuration, the second driver stage 220 may have the amplification characteristic of any one of classes A, AB, B, C, D, E, F, and S.

The virtual ground voltage means the power voltage that is applied to the second driver stage 220, in detail, means that the first driver stage 210 and the second driver stage 220 are connected in respect of voltage, so a power voltage is distributed to the stages 210 and 220, but actually power voltages are separately applied to the stages 210 and 220. Accordingly, the ground terminal 213 of the first driver stage 210 is not grounded actually, but connected with the power input terminal 222 of the second driver stage 220, so it has a virtual grounding effect.

The power stage 230 has an input terminal 231 connected with the output terminal 224 of the second driver stage 220 and receives and amplifies an output signal from the second driver stage 220, a power input terminal 232 through which a power voltage is applied from a power supply, a ground terminal 233 that is grounded, and an output terminal 234 through which the amplified signal of the second driver stage 220 is outputted as an output signal of the power stage 230. In this configuration, the power stage 230 may have the amplification characteristic of any one of classes A, AB, B, C, D, E, F, and S.

Comparing the power amplifier 200 having a stack structure illustrated in FIG. 2 with the multistage amplifier 100 illustrated in FIG. 1, there is a difference in that the ground terminal 213 of the first driver stage 210 is not grounded, but is connected to the power input terminal 222 of the second driver stage 220 and a virtual grounding power is applied. Further, there is a difference in that a power voltage is applied to the first driver stage 210 and the power stage 230 from the same power supply.

For example, when a power voltage of 3.3 V is applied to the first driver stage 210, there is an effect as if a power voltage of 1.65 V is separately applied to the first driver stage 210 and the second driver stage 220. In this case, since the same voltage as the first driver stage 210 is applied to the power stage 230, a voltage of 3.3 V is applied to the power stage 230. Accordingly, it is possible to apply a power voltage to the first driver stage 210, the second driver stage 220, and the power stage 230, using one power voltage. Therefore, as compared with the configuration illustrated in FIG. 1, it is possible to reduce the number of regulators for supplying different voltages to the first driver stage 210, the second driver stage 220, and the power stage 230, respectively.

Further, the driver stage or the power stage may be implemented in a differential amplification structure or a single-ended amplification structure. For example, all the first driver stage 210, the second driver stage 220, and the power stage 230 may be implemented in a differential amplification structure or a single-ended amplification structure. Further, the first driver stage 210 and the second driver stage 220 may be implemented in differential amplification structures and the power stage 230 may be implemented in a single-ended amplification structure, or the first driver stage 210 and the second driver stage 220 may be implemented in single-ended amplification structures and the power stage 230 may be implemented a differential amplification structure.

Figure 3:
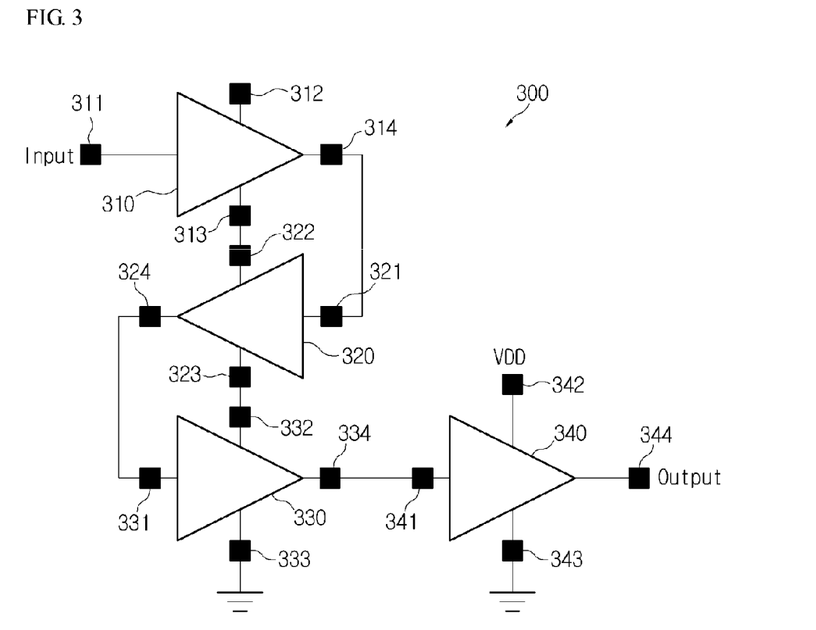
FIG. 3 is a circuit diagram added with a driver stage in the power amplifier having a stack structure illustrated in FIG. 2.

FIG. 3 is a circuit diagram added with a driver stage in the power amplifier having a stack structure illustrated in FIG. 2.

Referring to FIG. 3, a power amplifier 300 having a stack structure includes a first driver stage 310, a second driver stage 320, a third driver stage 330, and a power stage 340.

The first driver stage 310 has an input terminal 311 through which an input signal is inputted, a power input terminal 312 to which a power voltage is applied, a ground terminal 313 that is connected with a power input terminal 322 of the second driver stage 320, and an output terminal 314 that is connected with an input terminal 321 of the second driver stage 320.

The second driver stage 320 has an input terminal 321 connected with the output terminal 314 of the first driver stage 310, a power input terminal 322 connected with the ground terminal 313 of the first driver stage 310, a ground terminal 323 connected with a power input terminal 332 of the third driver stage 330, and an output terminal 324 connected with an input terminal 331 of the third driver stage 330.

The third driver stage 330 has an input terminal 331 connected with the output terminal 324 of the second driver stage 320, a power input terminal 332 connected with the ground terminal 323 of the second driver stage 320, a ground terminal 333 that is grounded, and an output terminal 334 connected with an input terminal 341 of the power stage 340.

The power stage 340 has an input terminal 341 that is connected with the output terminal 334 of the third driver stage 330, a power input terminal 342 to which the power voltage from the same power supply as the power input terminal 312 of the first driver stage 310 is applied, a ground terminal 343 that is grounded, and an output terminal 344 through which an input signal from the third driver stage 330 is amplified and outputted.

For example, when a power voltage of 4.5 V is applied to the power input terminal 312 of the first driver stage 310, actually a voltage of 1.5 V is applied to the first driver stage 310, the second driver stage 320, and the third driver stage 330, that is, the power voltage from a power supply is divided into three. Further, the power voltage of 4.5 V is applied to the power stage 340. Accordingly, the entire power amplifier 300 can be activated by only one power voltage of 4.5 V, so there is a need for only one regulator for supplying a power voltage.

Further, the third driver stage 330 can be repeatedly and sequentially connected at least once to the first or second driver stages 310 and 320. That is, in the same way of connecting the third driver stage 330, subordinate driver stages such as a fourth driver stage (not illustrated) and a fifth driver stage (not illustrated) can be additionally connected. In this case, the output terminal of the lowermost driver stage is connected with the input terminal 341 of the power stage 340 and the number of additional driver stages may depend on the user.

Figure 4:
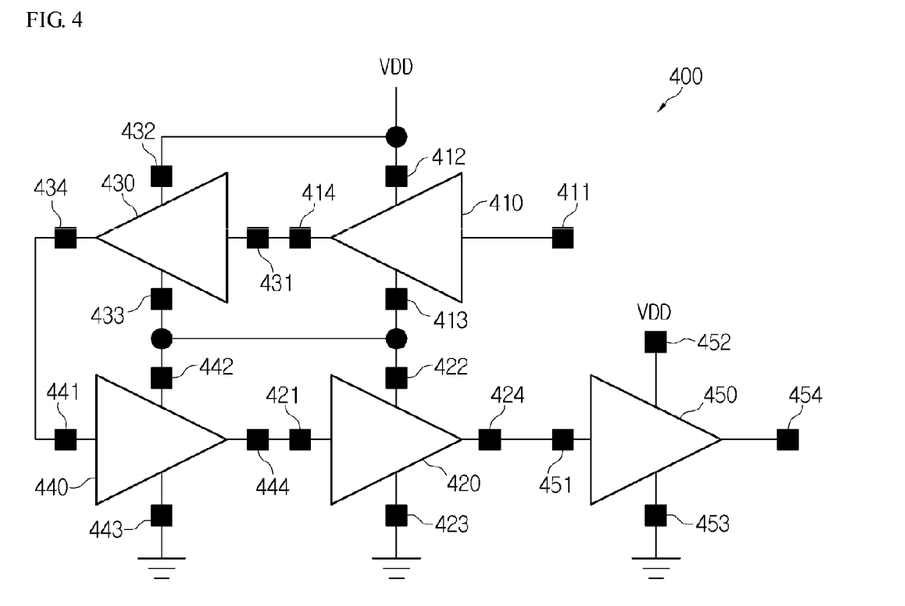
FIG. 4 is a circuit diagram added with a driver stage in a cascade type in the power amplifier having a stack structure illustrated in FIG. 2.

FIG. 4 is a circuit diagram added with a driver stage in a cascade type in the power amplifier having a stack structure illustrated in FIG. 2.

Referring to FIG. 4, a power amplifier 400 having a stack structure includes a first driver stage 410, a second driver stage 420, a third driver stage 430, a fourth driver stage 440, and a power stage 450.

The first driver stage 410 has an input terminal 411 through which an input signal is inputted, a power input terminal 412 to which a power voltage is applied, a ground terminal 413 that is connected with a power input terminal 422 of the second driver stage 420, and an output terminal 414 that is connected with an input terminal 431 of the third driver stage 430.

The second driver stage 420 has an input terminal 421 connected with an output terminal 444 of the fourth driver stage 440, a power input terminal 422 connected with the ground terminal 413 of the first driver stage 410, a ground terminal 423 that is grounded, and an output terminal 424 connected with an input terminal 451 of the power stage 450.

The third driver stage 430 has an input terminal 431 connected with the input terminal 411 of the first driver stage 410, a power input terminal 432 to which a power voltage is applied, a ground terminal 433 connected with a power input terminal 442 of the fourth driver stage 440, and an output terminal 434 connected with an input terminal 441 of the fourth driver stage 440.

The fourth driver stage 440 has an input terminal 441 connected with an output terminal 434 of the third driver stage 430, a power input terminal 442 connected with the ground terminal 413 of the first driver stage 410, the ground terminal 433 of the third driver stage 430, and the power input terminal 422 of the second driver stage 420, a ground terminal 443 that is grounded, and an output terminal 444 connected with an input terminal 421 of the second driver stage 420.

The power stage 450 has an input terminal 451 connected with the output terminal 424 of the second driver stage 420, a power input terminal 452 to which a power voltage of a power supply is applied, a ground terminal 453 that is grounded, and an output terminal 454 amplifying and outputting an output signal from the second driver stage 420.

In this configuration, the first driver stage 410 and the third driver stage 430 form one set by being connected in a cascade type and the second driver stage 420 and the fourth driver stage 440 form one set by being connected in a cascade type, so a power voltage from a power supply is distributed in parallel. For example, when a power voltage of 3.6 V is applied to the first driver stage 410, the third driver stage 430, and the power stage 450, actually, a power voltage of 1.8 V is applied to the first driver stage 410 and the third driver stage 430, a power voltage of 1.8 V is applied to the second driver stage 420 and the fourth driver stage 440, and a power voltage of 3.6 V is applied to the power stage 450.

Further, at least one of the third driver stage 430 and the fourth driver stage 440 can be repeatedly and sequentially connected at least once to the first driver stage 410 and the second driver stage 420 in a cascade type. The number of the added third driver stage 430 and fourth driver stage 440 may depend on the user.

Figure 5:
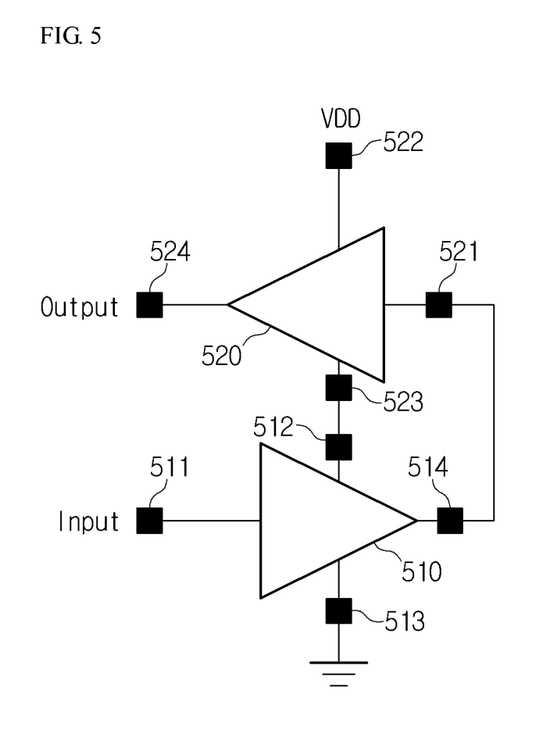
FIG. 5 is a circuit diagram with the positions of a first driver stage and a second driver stage changed in the power amplifier having a stack structure illustrated in FIG. 2.

FIG. 5 is a circuit diagram with the positions of a first driver stage and a second driver stage changed in the power amplifier having a stack structure illustrated in FIG. 2.

Referring to FIG. 5, a first driver stage 510 has an input terminal 511 to which an input signal is inputted, a power input terminal 512 that is connected with a ground terminal 523 of a second driver stage 520 and receives a virtual voltage, a ground terminal 513 that is grounded, and an output terminal 514 that is connected with an input terminal 521 of the second driver stage 520 and outputs an amplified input signal.

A second driver stage 520 has an input terminal 521 that is connected with the output terminal 514 of the first driver stage 510 and receives an amplified input signal, a power input terminal 522 to which a power voltage is applied, a ground terminal 523 that is connected with the power input terminal 512 of the first driver stage 510 and receives a virtual voltage, and an output terminal 524 that outputs an amplified signal to an external circuit (not illustrated).

As described above, comparing the first driver stage 510 and the second driver stage 520 illustrated in FIG. 5 with the first driver stage 210 and the second driver stage 220 illustrated in FIG. 2, there is a difference in that the first driver stage 510 positioned lower than the second driver stage 520 and a power voltage is applied to the power input terminal 522 of the second driver stage 520.

Figure 6:
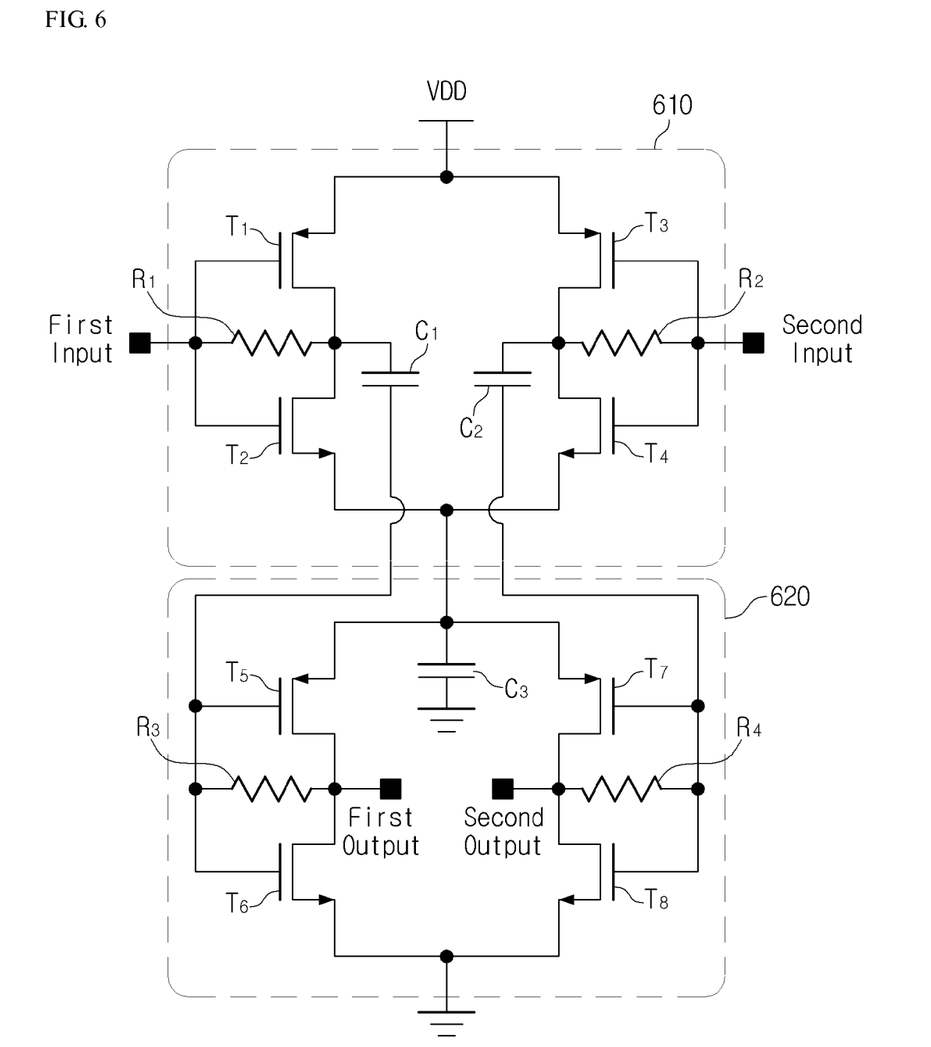
FIG. 6 is a circuit diagram illustrating a differential amplifier composed of the first driver stage and the second driver stage of the power amplifier having a stack structure illustrated in FIG. 2.

FIG. 6 is a circuit diagram illustrating a differential amplifier composed of the first driver stage and the second driver stage of the power amplifier having a stack structure illustrated in FIG. 2.

Referring to FIG. 6, a first driver stage 610 of a power amplifier having a differential structure includes a first transistor $T_1$, a second transistor $T_2$, a third transistor $T_3$, and a fourth transistor $T_4$. In this configuration, the first transistor $T_1$, the second transistor $T_2$, the third transistor $T_3$, and the fourth transistor $T_4$ may have the characteristic of any one of CMOS, BJT, HBT, FET, and HEMT. In the specification, the first transistor $T_1$ and the third transistor $T_3$ were set in a P-type mosfet, and the second transistor $T_2$ and the fourth transistor $T_4$ were set in an N-type mosfet, but the present invention is not limited thereto and the first transistor $T_1$ and the third transistor $T_3$ may be set in an N-type mosfet, and the second transistor $T_2$ and the fourth transistor $T_4$ may be in a P-type mosfet.

The first transistor $T_1$ has a source to which a power voltage is applied from a power supply, a gate to which a first input signal is inputted, and a drain that is connected with a drain of the second transistor. The second transistor $T_2$ has a polarity opposite to that of the first transistor $T_1$ and has a drain that is connected with the drain of the first transistor $T_1$, a gate to which a first input signal is inputted and which is connected with the gate of the first transistor $T_1$.

The third transistor $T_3$ has a polarity the same as that of the first transistor $T_1$ and has a source to which a power voltage is applied from a power supply, a gate to which a second input signal different from the first input signal is inputted, and a drain that is connected with a drain of the fourth transistor $T_4$. The fourth transistor $T_4$ has a polarity opposite to that of the third transistor $T_3$ and has a drain that is connected with the drain of the third transistor $T_3$, a gate to which a second input signal is inputted and which is connected with the gate of the third transistor $T_3$.

Further, the first driver stage 610 may further include a first resistor $R_1$ and a second resistor $R_2$. The first resistor $R_1$ has one end connected with the gate of the first transistor $T_1$ and the gate of the second transistor $T_2$ and the other end connected with the drain of the first transistor $T_1$ and the drain of the second transistor $T_2$. The second resistor $R_2$ has one end connected with the gate of the third transistor $T_3$ and the gate of the fourth transistor $T_4$ and the other end connected with the drain of the third transistor $T_3$ and the drain of the fourth transistor $T_4$. The resistors $R_1$ and $R_2$ are added to keep an input bias and an output bias the same.

Meanwhile, the second driver stage 620 includes a fifth transistor $T_5$, a sixth transistor $T_6$, a seventh transistor $T_7$, and an eighth transistor $T_8$. In this configuration, the fifth transistor $T_5$, the sixth transistor $T_6$, the seventh transistor $T_7$, and the eighth transistor $T_8$ may have the characteristic of any one of CMOS, BJT, HBT, FET, and HEMT. In the specification, the fifth transistor $T_5$ and the seventh transistor $T_7$ were set in a P-type mosfet, and the sixth transistor $T_6$ and the eighth transistor $T_8$ were set in an N-type mosfet, but the present invention is not limited thereto and the fifth transistor $T_5$ and the seventh transistor $T_7$ may be set in an N-type mosfet, and the sixth transistor $T_6$ and the eighth transistor $T_8$ may be in a P-type mosfet.

A source of the fifth transistor $T_5$ is connected with a source of the second transistor $T_2$ and a source of the fourth transistor $T_4$ and receives a virtual voltage. Further, a gate is connected with a drain of the first transistor $T_1$ and a drain of the second transistor $T_2$, in which a first capacitor $C_1$ may be connected and block a direct current component. The sixth transistor $T_6$ has a polarity opposite to that of the fifth transistor $T_5$ and has a drain connected with the drain of the fifth transistor $T_5$ and a gate connected with the gate of the fifth transistor $T_5$.

The seventh transistor $T_7$ has the same polarity as the fifth transistor $T_5$ and has a source connected with the source of the second transistor $T_2$ and the source of the fourth transistor $T_4$ and receiving a virtual voltage. Further, the gate is connected with the drain of the third transistor $T_3$ and the drain of the fourth transistor $T_4$, in which a second capacitor $C_2$ may be connected and block a direct current component. The eighth transistor $T_8$ has a polarity opposite to that of the seventh transistor $T_7$ and has a drain connected with the drain of the seventh transistor $T_7$ and a gate connected with the gate of the seventh transistor $T_7$.

Further, the second driver stage 620 may further include a third resistor $R_3$ and a fourth resistor $R_4$. The third resistor $R_3$ has one end connected with the gate of the fifth transistor $T_5$ and the gate of the sixth transistor $T_6$ and the other end connected with the drain of the fifth transistor $T_5$ and the drain of the sixth transistor $T_6$. The fourth resistor $R_4$ has one end connected with the gate of the seventh transistor $T_7$ and the gate of the eighth transistor $T_8$ and the other end connected with the drain of the seventh transistor $T_7$ and the drain of the eighth transistor $T_8$. The resistors $R_3$ and $R_4$ are added to keep an input bias and an output bias the same.

Meanwhile, a first output signal and a second output signal of the first driver stage 610, which correspond to a first input signal and a second input signal, are supplied to the input terminal of a power stage (not illustrated). The power stage is connected with the node, where the drains of the fifth transistor $T_5$ and the sixth transistor $T_6$ are connected, and can receive a first output signal. Further, the power stage is connected with the node, where the drains of the seventh transistor $T_7$ and the eighth transistor $T_8$ are connected, and can receive a second output signal.

For example, a power voltage of 3.3 V is applied to the power input terminals of the first transistor $T_1$ and the third transistor $T_3$, a power voltage of about 1.7 V is applied to the first driver stage 610 and the second driver stage 620. Accordingly, a first output signal and a second output signal are outputted, together with a power voltage of about 0.8 V, to the power stage. In this case, the power stage requires a power voltage of 0.7 V or more to normally operate its transistor and the first output signal and the second output signal have a power voltage of 0.8 V as input, so the power stage can be activated without an additional power voltage.

Figure 7:
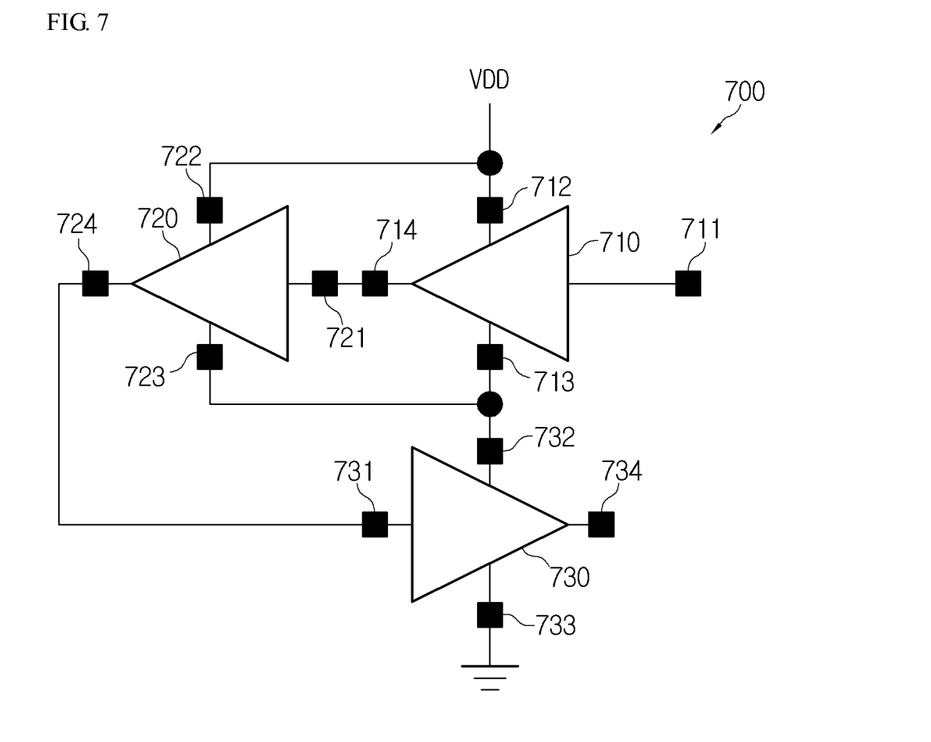
FIG. 7 is a circuit diagram of a power amplifier having a stack structure according to another embodiment of the present invention.

FIG. 7 is a circuit diagram of a power amplifier having a stack structure according to another embodiment of the present invention.

Referring to FIG. 7, a power amplifier 700 having a stack structure according to an embodiment of the present invention includes a first driver stage 710, a second driver stage 720, and a power stage 730.

The first driver stage 710 has an input terminal 711 through which an input signal is inputted, a power input terminal 712 to which a power voltage is applied, a ground terminal 713 that is connected with a power input terminal 732 of the power stage 730, and an output terminal 714 that is connected with an input terminal 721 of the second driver stage 720.

The second driver stage 720 has an input terminal 721 connected with the output terminal 714 of the first driver stage 710, a power input terminal 722 connected with the power input terminal 712 of the first driver stage 710 and receiving a power voltage, a ground terminal 723 connected with a power input terminal 732 of the power stage 730, and an output terminal 724 connected with an input terminal 731 of the power stage 730. That is, the first driver stage 710 and the second driver stage 720 are connected in a cascade type.

The power stage 730 has an input terminal 731 connected with the output terminal 724 of the second driver stage 720, a power input terminal 732 connected with the ground terminal 713 of the first driver stage 710 and the ground terminal 723 of the second driver stage 720, and a ground terminal 733 that is grounded, and an output terminal 734 for outputting an amplified signal of the power stage 730.

Comparing the power amplifier 700 illustrated in FIG. 7 with the power amplifier 200 illustrated in FIG. 2, there is a difference in that the first driver stage 210 and the second driver stage 220 are connected in a stack structure in the power amplifier 200 illustrated in FIG. 2, but the first driver stage 710 and the second driver stage 720 are connected in a cascade type in the power amplifier 700 illustrated in FIG. 7, and the driver stage, which includes the first driver stage 710 and the second driver stage 720, and the power stage 730 are connected in a stack structure.

Further, the driver stage or the power stage may be implemented in a differential amplification structure or a single-ended amplification structure. For example, all the first driver stage 710, the second driver stage 720, and the power stage 730 may be implemented in a differential amplification structure or a single-ended amplification structure. Further, the first driver stage 710 and the second driver stage 720 may be implemented in differential amplification structures and the power stage 730 may be implemented in a single-ended amplification structure, or the first driver stage 710 and the second driver stage 720 may be implemented in single-ended amplification structures and the power stage 730 may be implemented a differential amplification structure.

As described above, according to embodiments of the present invention, since a plurality of driver stages included in a multistage amplifier are connected in a stack structure, it is possible to reduce the number of regulators for supplying a power voltage and decrease the design area of an integrated circuit.

Although the present invention has been described on the basis of the preferred embodiments described with reference to the drawings, it is not limited thereto. Therefore, the present invention should be construed on the basis of claims intended for including modifications that can be achieved apparently from the embodiments.

The invention claimed is:

1. A power amplifier having a stack structure, comprising:
    a first driver stage that receives a power voltage from a power supply and receives and amplifies an input signal;
    a second driver stage that has a power input terminal connected with a ground terminal of the first driver stage and receiving a virtual ground voltage and an input terminal connected with an output terminal of the first driver stage, and receives and amplifies an output signal from the first driver stage; and
    a power stage that receives the power voltage from the power supply and has an input terminal connected with an output terminal of the second driver stage, and receives and amplifies an output signal from the second driver stage, wherein a ground terminal of the second driver stage is connected with a power input terminal of the first driver stage and a virtual ground voltage is applied to the first driver stage, and the power voltage is applied to the second driver stage from the power supply.

2. The power amplifier of claim 1, further comprising a third driver stage that has a power input terminal connected with a ground terminal of the second driver stage and receiving the virtual ground voltage and an input terminal connected with an output terminal of the second driver stage, and receives and amplifies an output signal from the second driver stage, wherein the power stage receives and amplifies an output signal from the third driver stage.

3. The power amplifier of claim 2, wherein the third driver stage is repeatedly and sequentially connected at least once to the first or the second driver stage.

4. The power amplifier of claim 1, further comprising:
a third driver stage that receives the power voltage from the power supply, has an input terminal connected with the output terminal of the first driver stage, and receives and amplifies an output signal from the first driver stage; and
a fourth driver stage that has a power input terminal connected with ground terminals of the first and third driver stages and receiving the virtual ground voltage and an input terminal connected with an output terminal of the third driver stage, and receives and amplifies an output signal from the third driver stage,
wherein the input terminal of the second driver stage is connected with an output terminal of the fourth driver stage and the second driver stage receives and amplifies an output signal from the fourth driver stage.

5. The power amplifier of claim 4, wherein the third driver stage and the fourth driver stage are repeatedly and sequentially connected at least once to correspond to the first driver stage and the second driver stage.

6. The power amplifier of claim 1, wherein the first driver stage includes:
a first transistor that has a source receiving the power voltage from the power supply and a gate receiving a first input signal;
a second transistor that has a polarity opposite to the polarity of the first transistor and has a drain connected with a drain of the first transistor and a gate receiving the first input signal;
a third transistor that has a source receiving the power voltage from the power supply and a gate receiving a second input signal; and
a fourth transistor that has a polarity opposite to the polarity of the third transistor and has a drain connected with a drain of the third transistor and a gate receiving the second input signal.

7. The power amplifier of claim 6, wherein the second driver stage includes;
a fifth transistor that has a source connected with a source of the second transistor and a source of the fourth transistor and a gate connected with a drain of the first transistor and a drain of the second transistor;
a sixth transistor that has a polarity opposite to the polarity of the fifth transistor and has a drain connected with a drain of the fifth transistor and a gate connected with the gate of the fifth transistor;
a seventh transistor that has a source connected with the source of the second transistor and the source of the fourth transistor and a gate connected with a drain of the third transistor and the drain of the fourth transistor; and
an eighth transistor that has a polarity opposite to the polarity of the seventh transistor and has a drain connected with a drain of the seventh transistor and a gate connected with the gate of the seventh transistor.

8. The power amplifier of claim 6, further comprising:
a first resistor that has one end connected with the gate of the first transistor and the gate of the second transistor and the other end connected with the drain of the first transistor and the drain of the second transistor; and
a second resistor that has one end connected with the gate of the third transistor and the gate of the fourth transistor and the other end connected with the drain of the third transistor and the drain of the fourth transistor.

9. The power amplifier of claim 7, further comprising:
a third resistor that has one end connected with the gate of the fifth transistor and the gate of the sixth transistor and the other end connected with the drain of the fifth transistor and the drain of the sixth transistor; and
a fourth resistor that has one end connected with the gate of the seventh transistor and the gate of the eighth transistor and the other end connected with the drain of the seventh transistor and the drain of the eighth transistor.

10. The power amplifier of claim 7, wherein the power stage receives a first output signal by being connected with a node that is connected with the drains of the fifth transistor and the sixth transistor and receives a second output signal by being connected with a node that is connected with the drains of the seventh transistor and the eighth transistor.

* * * * *